United States Patent [19]

Krishnamoorthy et al.

[11] Patent Number: 5,777,318
[45] Date of Patent: Jul. 7, 1998

[54] SMART PIXEL ARRAY USING SINGLE DIODE FOR DETECTION AND MODULATION

[75] Inventors: Ashok V. Krishnamoorthy, Middletown; David A. B. Miller, Fair Haven, both of N.J.

[73] Assignee: Lucent Technologies Inc., Murray Hill, N.J.

[21] Appl. No.: 588,155

[22] Filed: Jan. 17, 1996

[51] Int. Cl.$^6$ .................................................. H01J 40/14
[52] U.S. Cl. ........................... 250/214 LS; 250/551; 359/154; 327/514
[58] Field of Search .................. 250/214 LS, 214 R, 250/551; 359/189, 190, 195, 154; 327/108, 109, 110, 111, 112, 514; 377/102

[56] References Cited

U.S. PATENT DOCUMENTS

| | | | |
|---|---|---|---|
| 5,093,565 | 3/1992 | Lentine | 250/214 LS |
| 5,233,184 | 8/1993 | Chirovsky et al. | 250/214 LS |
| 5,329,113 | 7/1994 | Taylor et al. | 250/214 LS |
| 5,483,186 | 1/1996 | Miller et al. | 250/214 LS |
| 5,508,508 | 4/1996 | Miller | 250/214 LS |

OTHER PUBLICATIONS

Miller et al., "Field–Effect Transistor Self–Electro–Optic Effect Device: Integrated Photodiode, Quantum Wall Modulator and Transistor", IEEE Photonics Technology Letters, vol. 1, pp. 61–64, Jan. 1989.

Goossen et al., "GaAs MQW Modulators on Silicon ICs", Invited Paper, IEEE LEOS Topical Meeting on Smart Pixels, Jul. 1994.

Weste et al., "Principles of CMOS VLSI Design" Addison–Wesley Publishing Co., 2nd Edition, pp. 86–90, 1993.

*Primary Examiner*—Edward P. Westin
*Assistant Examiner*—John R. Lee

[57] ABSTRACT

A smart pixel array is disclosed wherein a single optical beam can be used to transmit information to and from each subarea or cell of the pixel array. An optical P-I-N diode with an intrinsic MQW region is present in each subarea, and the optical beam is oriented to impinge on the diode. A first transmission gate couples information to be transmitted to the diode during a transmit interval, and information received by the diode is coupled through a second transmission gate to a receiver circuit during a receive interval. A third transmission gate couples a reset potential to the diode during spacing intervals between the transmit and receive intervals.

8 Claims, 3 Drawing Sheets

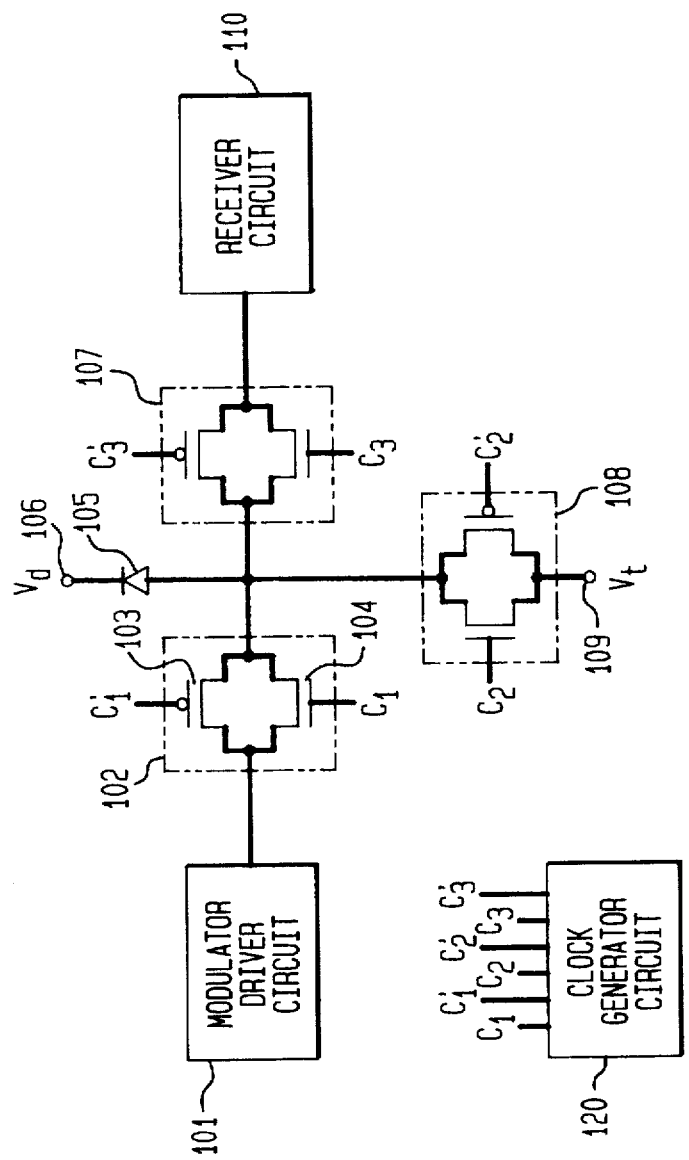

SMART PIXEL ARRAY USING SINGLE DIODE FOR DETECTION AND MODULATION

FIELD OF THE INVENTION

The present invention relates to pixel arrays and more particularly to so-called smart pixel arrays wherein information is optically transmitted out of, and received by, subareas of the array. This information is typically processed within the subareas using electronic circuitry.

DESCRIPTION OF THE RELATED ART

Surface-normal optical interconnections can be used to provide high density, high bandwidth, and global interconnections between electronic components in a high-density very large scale integration (VLSI) environment. The well known field-effect transistor-self-electrooptic effect device (FET-SEED) technology provides the ability to monolithically integrate large-scale integration of electronic circuits using GaAs MESFETs (Metal-Evaporated Semiconductor Field-Effect Transistors) with GaAs/AlGaSa MQW (Multiple Quantum Well) detectors and modulators for optical input and output. See the article entitled "*Field-effect transistor self-electro-optic effect device: integrated photodiode, quantum well modulator and transistor*", by D. A. B. Miller et al., *IEEE Photonics Technology Letters*, Vol. 1, pages 61–64, 1989.

It has also been shown recently that GaAs MQW light-detectors and light-modulators can be attached onto a prefabricated silicon VLSI circuit using a well established flip-chip bonding technique. See the article entitled "*GaAs MQW modulators on silicon ICs*", by K. W. Goossen et al., Invited Paper, IEEE LEOS Topical Meeting on Smart Pixels, July 1994. As a result, two VLSI circuits, either on the same or on different circuit boards, can be optically connected by constructing a smart pixel array for each of the VLSI circuits. Each cell or subarea of the array can be fabricated to have a detector, a modulator, some local, custom-designed processing circuitry, and circuits to connect the processing circuitry to the detector and modulator. The smart pixel arrays can then be made to communicate with each other through the use of an optical system comprised of lenses, prisms, beamsplitters and holographic gratings. Such an optical interconnection system can also facilitate communications between VLSI circuits on the same circuit board or even between separate VLSI circuits on a single chip.

For typical smart pixel applications such as photonic switching, the optical detectors and the modulators can be identical devices, that is, a simple P-I-N diode structure with an active MQW intrinsic region. The same process can be used to fabricate both the detectors and modulators. Thus, fabrication costs are low because a homogenous array of GaAs/AlGaAs MQW devices is grown for both modulators and detectors. The electronic circuitry and the optical interconnection is what distinguishes an optical receiver from an optical transmitter. In feed-forward systems such as photonic switching systems, each subarea of the smart pixel array may only need either a detector or modulator. In these cases, the optical interconnecting paths can be provided by beam-splitters without encountering excessive power losses due to the beamsplitting and scattering. If however, the smart pixel array is to be used in a system that requires bidirectional communication to each subarea of the smart pixel array, the optical interconnection system between the separate detector and modulator on each subarea of the smart pixel array becomes increasingly complex with much greater losses in the optical system. Several applications in telecommunications, parallel computing, and image processing do require bidirectional communications.

SUMMARY OF THE INVENTION

The number of optical beams and number of optical diodes is cut in half by the present invention wherein a single optical diode is used as a detector and modulator in each subarea of a smart pixel array. During a receive cycle, the optical diode is gated through to the input of an electronic receiver circuit. During a transmit cycle, the optical diode acts as a modulator, and the output of an electronic transmit circuit is gated through to the diode. As a result, a single optical beam can be used to transmit to and from each subarea of the smart pixel array. In order to avoid spurious signals, the optical diode is reset to the proper operating potential by gating a reset potential through to the optical diode before the circuit is toggled between receiver and transmitter modes.

In accordance with the embodiment described, a pass-transistor transmission gate is used to provide the gating action between the diode and the electronic receive and transmit circuits. In addition, the transmit and receive circuits each include a CMOS inverter circuit with the receiver circuit including a feedback resistor between input and output of the inverter circuit to form a transimpedance amplifier.

BRIEF DESCRIPTION OF THE DRAWING

FIG. 1 is a schematic diagram of the preferred embodiment of the electronic circuit used to practice the present invention;

DESCRIPTION OF THE PREFERRED EMBODIMENT

Figure 5:
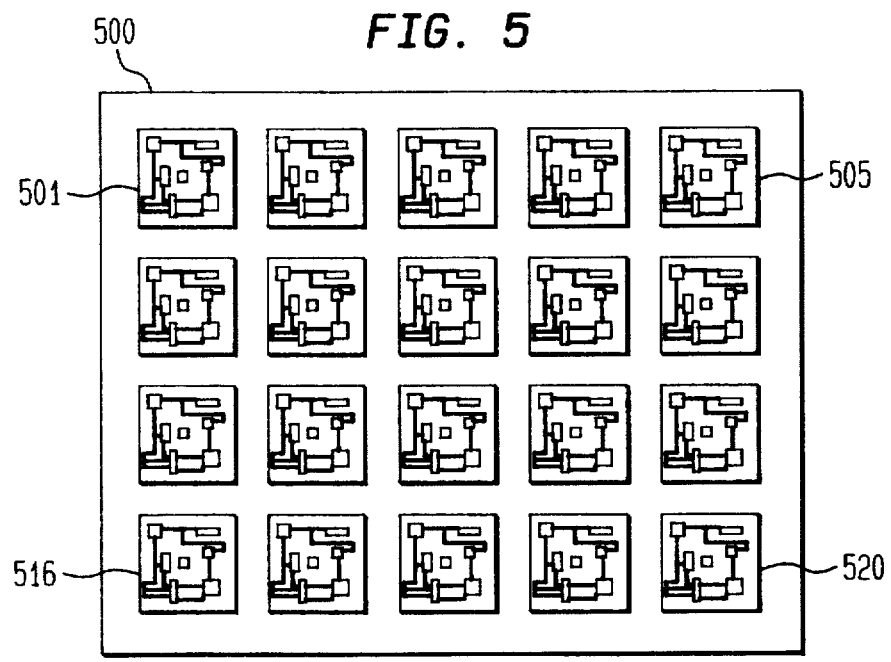
FIG. 5 is a pictorial diagram of a smart pixel array constructed in accordance with the present invention.

A smart pixel array of the type that can be used to provide parallel optical communications channels between VLSI circuits is shown in pictorial diagram form as smart pixel array 500 in FIG. 5. Twenty identical subareas 501–520, each one of which constitutes a single pixel in the smart pixel array 500, are shown in FIG. 5. It should be apparent to those skilled in the art that the number of subareas shown is quite arbitrary, and the number need only be equal to the number of parallel optical communications channels to be utilized by the VLSI circuit associated with the smart pixel array. In cases where the number of subareas or pixels do not all fit on a single chip, the pixel array can be partitioned into multiple chips on a multi-chip module printed circuit board. Since the subareas are identical, only one of them need be described in detail. Subarea 501 is shown in FIG. 6.

Figure 6:
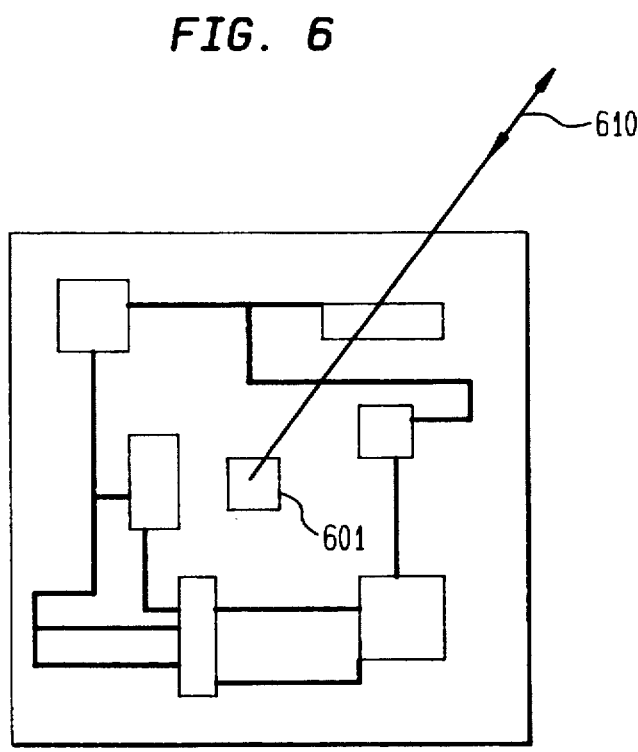
FIG. 6 is a pictorial diagram of a single cell or subarea of the smart pixel array shown in FIG. 5.

As shown in FIG. 6, an optical beam 610 is caused to impinge on an region 601 of subarea 501 that contains a P-I-N optical diode 601 with an intrinsic multiple quantum well (MQW) region. Typically, optical beam 610 is oriented such that it is normally incident to the plane of the pixel array. During receive intervals, the amplitude variations present on optical beam 610 are detected by the optical diode and presented as an output photocurrent by the diode which photocurrent is used to develop a receive signal. During transmit intervals, current variations produced in the diode by a transmit signal cause the diode to modulate the amplitude of optical beam 610. It is the essence of the present invention to advantageously use the same optical beam to both transmit and receive in each subarea, or pixel, of the array. This feature permits a reduction in the complexity of the optical system required to communicate between two or more smart pixel arrays.

This advantageous use of a single diode within each subarea of the smart pixel array is accomplished in a silicon CMOS implementation by the electronic circuit shown in schematic diagram form in FIG. 1. As indicated in FIG. 1, a modulator driver circuit 101 couples a transmit signal to the input of a pass-transistor transmission gate 102. The transmit signal is typically digital, and it contains information to be transmitted in the form of voltage variations. The pass-transistor transmission gate is identical to the transmission gate described on pages 86–90 of the text entitled "*Principles of CMOS VLSI Design*", by Neil H. E. Weste and Kamran Eshraghian, Addison-Wesley Publishing Co., Second Edition, 1993. In brief, transmission gate 102 is constructed of a PMOS transistor 103 and an NMOS transistor 104 connected in parallel with the source of one connected to the source of the other and the drain of one connected to the drain of the other. The junction of the sources serve as an input to gate 102, and the junction of the drains serve as an output of gate 102. The gate is controlled by applying a control signal $C_1$ to the NMOS transistor 104 and a complementary version of the control signal to PMOS transistor 103. As pointed out in the above-identified text, use of these complementary gating signals with this type of transmission gate permits the NMOS to effectively couple a good digital zero to the output, and permits the PMOS to effectively couple a good digital one to the output of the gate during the intervals when the gate is enabled by the control signal.

The output of transmission gate 102 is coupled to the anode of a P-I-N optical diode 105 whose cathode is connected to an external positive potential source, $V_d$, by way of terminal 106. $V_d$ is chosen to be a sufficiently positive voltage so that the diode is always reverse-biased. When transmission gate 102 is enabled by the control signal $C_1$, the digital transmit signal from circuit 101 is coupled through to optical diode 105, and the diode is caused to modulate optical beam 610 by virtue of its intrinsic MQW.

A transmission gate 107, identical in construction to gate 102, has its input connected to the anode of optical diode 105 and its output connected to a receiver circuit 110. Transmission gate 107 is enabled by an enabling pulse in a control signal $C_3$. During the intervals when gate 107 is enabled, any variations in the current provided by diode 105 due to the amplitude variations present in optical beam 610 will be coupled through as an electrical signal to the input of receiver circuit 110.

Figure 2A:
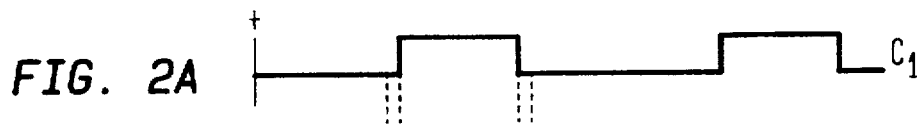
FIGS. 2(A), 2(B), and 2(C) are voltage waveforms useful in describing the operation of the present invention.

Meaningful bidirectional communications can be established from the pixel subarea including diode 105 only if gates 102 and 107 are not enabled at the same time. The control signals $C_1$ and $C_3$ are shown as the voltage versus time waveforms in FIGS. 2A and 2C respectively. The gates are enabled when a positive pulse is present in the voltage waveform. Accordingly, transmission gate 102 is only enabled by positive pulses of the type shown in FIG. 2A between the times designated as 202 and 203. Similarly, transmission gate 107 is enabled only during the positive pulses in the waveform of FIG. 2C of the type shown between times designated as 204 and 205. In this way the single optical diode is toggled between transmitting and receiving information from the pixel subarea in which it is present.

Figure 2B:
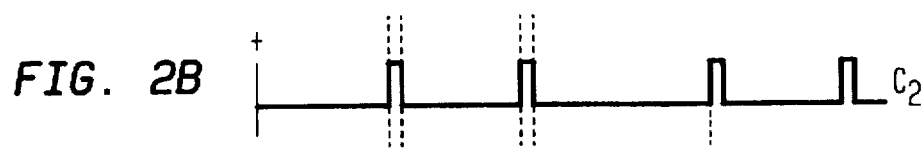
Figure 2C:
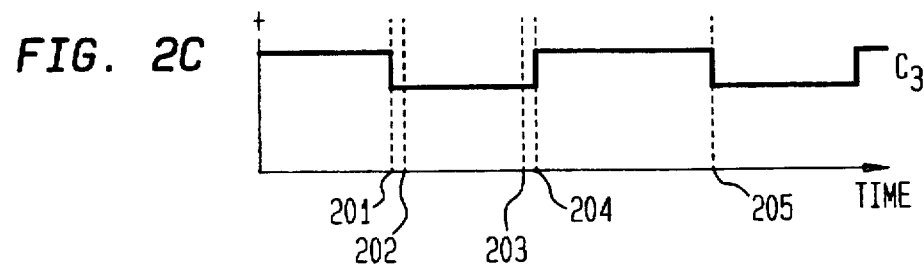

In accordance with the present invention, the transmit intervals and the receive intervals are not adjacent to each other. As indicated in FIG. 2, there is a spacing interval between the receive interval and the transmit interval, for example, the interval between times designated 201 and 202, and a spacing interval between the transmit and the receive interval, for example, the interval between the times designated 203 and 204. During these spacing intervals, a third transmission gate 108 couples a reset potential through to the anode of optical diode 105. As indicated in FIG. 1, transmission gate 108 has its output connected to the anode of diode 105 and its input is connected to an external potential source $V_r$, on terminal 109. The control inputs of gate 108 are connected to receive a control signal $C_2$ and its complementary version. During the spacing intervals, an enabling voltage is applied to gate 108 by waveform $C_2$ as indicated in FIG. 2B, and the potential $V_r$ is thereby coupled through to the anode of diode 105. The potential $V_r$ is chosen such that gate 108 provides the anode of diode 105 with the potential equal to the logic value that is equivalent to zero information. As a result, spurious signals are prevented from being generated.

Also shown in FIG. 1 is a clock generator circuit 120 which provides the control signals, $C_1$, $C_2$, $C_3$, and their complementary versions. In most cases, this clock generator circuit 120 need only be present at a single location on the printed circuit board containing the smart pixel array, and its output control signals can be coupled to the appropriate transmission gates in the subareas of the pixel array. Although the operation of the transmit and receive modes in the pixel subareas will generally be synchronized with respect to each other, the present invention does not require this synchronization.

Figure 3:
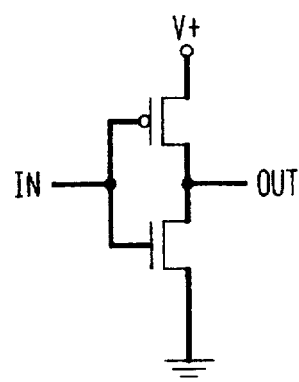
FIGS. 3 and 4 are schematic diagrams of circuits that are useful in implementing the circuits shown as blocks in FIG. 1.
Figure 4:
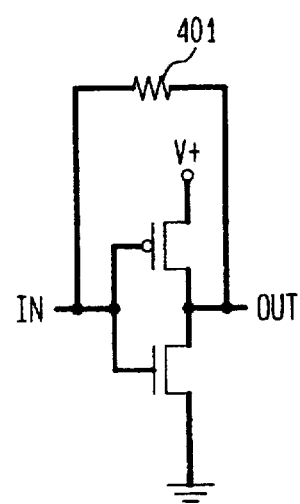

FIG. 3 shows one possible implementation of the modulator driver circuit 101 using a simple single stage CMOS inverter. FIG. 4 shows one possible implementation of the receiver circuit using a well known transimpedance receiver which is constructed of a CMOS inverter stage with a feedback resistor 401 connected between input and output of the inverter. With these circuits, the potential $V_r$ is equal to the potential normally present at the junction of the gates in the CMOS inverter.

What has been described hereinbefore is a specific embodiment of the present invention. Numerous departures may be made by those skilled in the art without departing from the spirit and scope of the present invention. For example, other types of circuit such as a tri-state buffer could be utilized to provide the function of the transmission gate. In addition, an additional gate may be necessary in some applications to use different reset potentials ($V_r$) between the receiver and transmitter operation modes. Similarly, different supply voltages ($V_d$) during the receiver and transmitter modes may also require an additional gate.

What is claimed is:

1. A pixel array for use in optically connecting a VLSI circuit to other VLSI circuits comprising a plurality of subareas each one of which subareas comprises an optical device capable of operating as a detector or modulator, a transmitter circuit for providing a transmit signal representing information to be transmitted from said each one of said subareas, a first gate having a control input for coupling said transmit signal to said optical device in response to an enabling pulse at its control input, a receiver circuit for providing an output signal representing information optically presented to said each one of said subareas, a second gate having a control input for connecting said optical device to said receiver circuit in response to an enabling pulse at its control input, a third gate having a control input for coupling a reset potential to said optical device in response to an enabling pulse at its control input, and a clock generator for providing the enabling pulse to said third gate during the time intervals between the enabling pulses to said first and second gates.

2. A pixel array as defined in claim 1 wherein said optical device is a diode having a P-I-N structure.

3. A pixel array as defined in claim 2 wherein each one of said first, second, and third gates comprises a P-type MOSFET and an N-type MOSFET each having a source, gate and drain, the source of said P-type MOSFET and said N-type MOSFET being connected together to form a junction which serves as an input to their respective gate, the drain of said P-type MOSFET and the drain of said N-type MOSFET being connected together to form a junction which serves as an output of their respective gate, and the gate of said P-type MOSFET and the gate of said N-type MOSFET being connected to receive enabling pulses from said clock generator.

4. A pixel array as defined in claim 3 wherein said transmitter circuit comprises a CMOS inverter circuit having an input and an output with its output connected to the input of said receiver gate, said receiver circuit comprises a second CMOS inverter circuit having an input and an output with its input connected to the output of said receiver gate, and a feedback resistor is connected between the output and input of said second CMOS inverter circuit.

5. An optical detector and modulator circuit having an input and an output for providing a receive signal at its output which represents by its amplitude information present on an external optical beam during a receive interval, and for modulating the external optical beam in accordance with the amplitude of an external transmit signal at said input during a transmit interval, said optical detector and modulator comprising an optical semiconductor device capable of operating as a detector or modulator, said optical semiconductor device being orientated such that said external optical beam impinges on said optical semiconductor device, first gating means for coupling said external transmit signal at said input to said optical semiconductor device during said transmit interval, second gating means for coupling potentials developed across said optical semiconductor device to said output during said receive interval, and third gating means for coupling an external reset potential to said optical semiconductor device during intervals between said transmit and receive intervals.

6. An optical detector and demodulator circuit as defined in claim 5 wherein said optical semiconductor device is an optical diode constructed with a P-I-N structure having an intrinsic multiple quantum well region.

7. An optical detector and modulator circuit as defined in claim 5 wherein each one of said first, second, and third gating means includes a pass-transistor transmission gate comprising a P-type MOSFET and an N-type MOSFET each having a source, gate and drain electrodes, the source electrodes of said P-type MOSFET and said N-type MOSFET being connected together to form a junction which serves as an input to their respective pass-transistor transmission gate, the drain electrodes of said P-type MOSFET and the drain of said N-type MOSFET being connected together to form a junction which serves as an output of their respective pass-transistor transmission gate.

8. An optical detector and modulator circuit as defined in claim 7 wherein said first gating means further includes a CMOS inverter circuit having an input and an output with its output connected to the input of the pass-transistor transmission gate in said first gating means, said second gating means further includes a second CMOS inverter circuit having an input and an output with its input connected to the output of the pass-transistor transmission gate in said second gating means, and a feedback resistor is connected between the output and input of said second CMOS inverter circuit.

* * * * *